United States Patent [19]

Christian

[11] Patent Number: 5,124,668
[45] Date of Patent: Jun. 23, 1992

[54] SYSTEM FOR CREATING DISTORTION IN ELECTRIC MUSICAL INSTRUMENTS

[75] Inventor: David E. Christian, Danbury, Conn.
[73] Assignee: CB Labs, Bridgeport, Conn.
[21] Appl. No.: 666,804
[22] Filed: Mar. 8, 1991

Related U.S. Application Data

[60] Continuation-in-part of Ser. No. 417,789, Oct. 4, 1989, Pat. No. 5,008,634, which is a division of Ser. No. 274,443, Nov. 18, 1988, Pat. No. 4,899,115.

[51] Int. Cl.⁵ .............................................. H03F 3/191
[52] U.S. Cl. .................................... 330/302; 330/306; 381/106
[58] Field of Search ............... 330/126, 302, 303, 304, 330/305, 306; 381/106, 118, 120; 333/14

[56] References Cited

U.S. PATENT DOCUMENTS 3,493,669  2/1970  Elbrecht et al. ................. 330/306 X
3,932,819  1/1976  Spencer ......................... 330/126 X
4,815,142  3/1989  Imreh ............................. 381/106

Primary Examiner—Steven Mottola
Attorney, Agent, or Firm—Michael L. Goldman

[57] ABSTRACT

A system is provided for use with an electrical musical instrument for conditioning electrical signals generated by the instrument and for creating controlled distortion. The system includes an amplifier circuit having an input for responding to the signals and an output to provide a conditioned output signal. There is included at least one bandpass filter for frequency preemphasis of the input signal. A limiting circuit is operatively connected to the bandpass filters limiting the amplitude of signals received from the bandpass filters to produce a relatively high distorted, long sustained signal. A notch filter operatively connected to the limiting circuit reduces the heavy mid-range frequency content produced by the combination of the bandpass filters and the limiting circuit. A low pass filter operatively connected to the notch filter further conditions the signal generating a conditioned output signal.

41 Claims, 13 Drawing Sheets

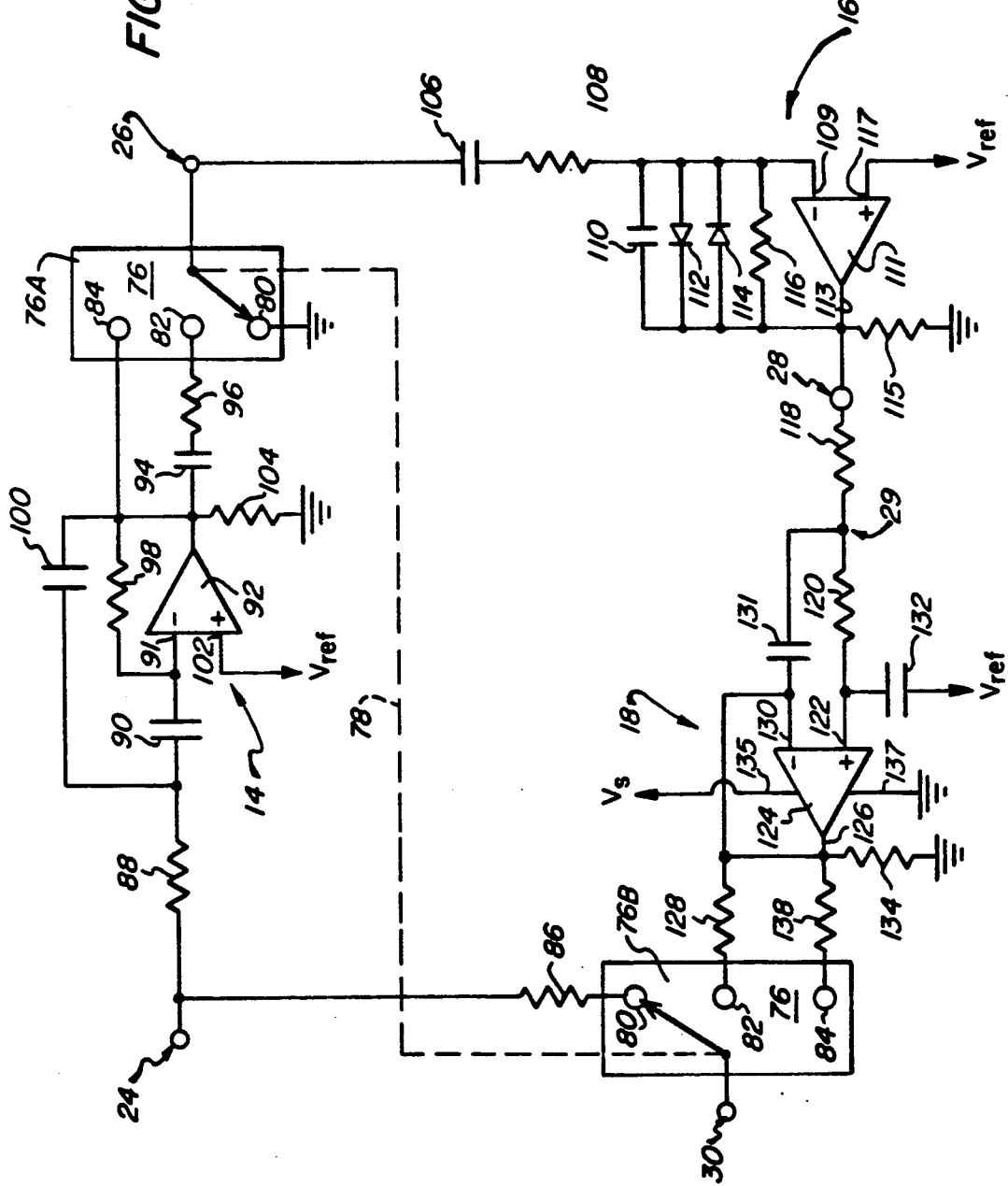

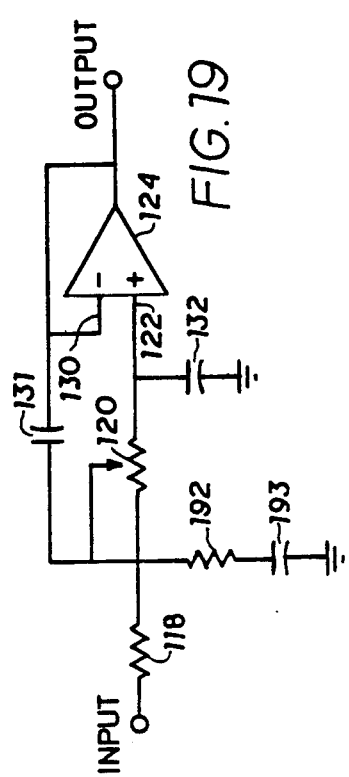
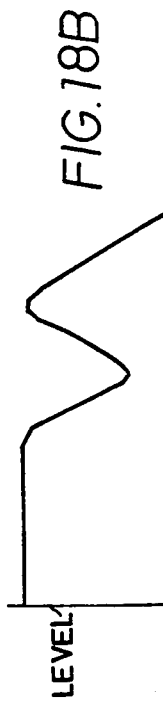
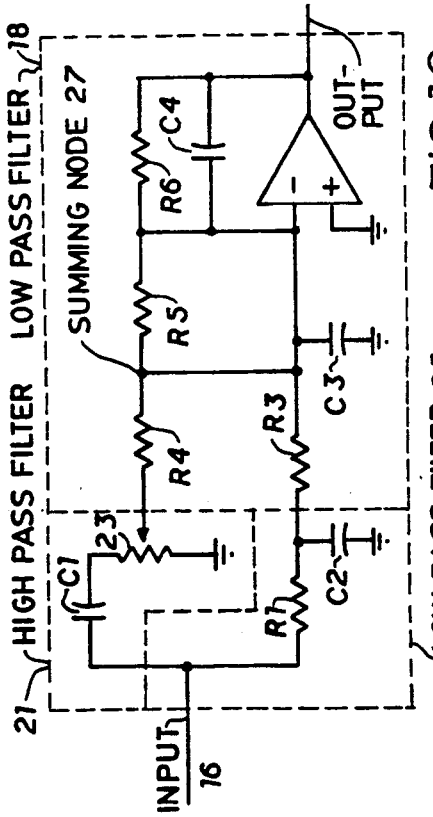
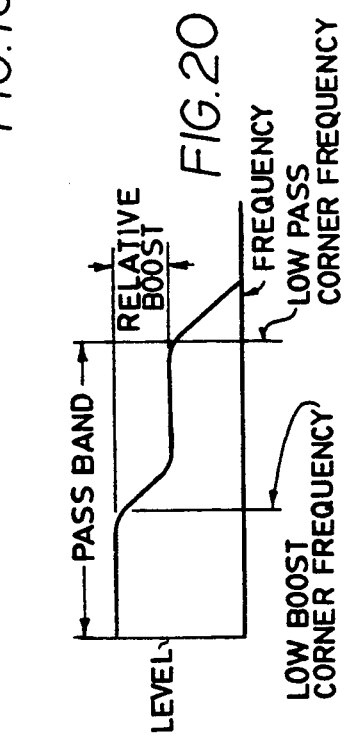

SYSTEM FOR CREATING DISTORTION IN ELECTRIC MUSICAL INSTRUMENTS

This application is a continuation-in-part of U.S. patent application Ser. No. 07/417,789 filed Oct. 4, 1989, now U.S. Pat. No. 5,008,634 which is a continuation-in-part of U.S. patent application Ser. No. 07/274,443, filed Nov. 18, 1988, now U.S. Pat. No. 4,899,115.

FIELD OF THE INVENTION

The present invention relates in general to systems for use with electric musical instruments which provide dynamic range control and controlled distortion, and to a circuit for controlling the dynamic range of instrument output, while preserving tonal qualities of the instrument.

BACKGROUND OF THE INVENTION

Electronic stringed musical instruments such as guitar and bass often have a wide dynamic range, typically greater than 60 decibels. Such widely varying signals when passed through an amplifier circuit can cause problems, particularly when low voltage or battery operated electronic circuits are used to process the signals. In order to maintain high average signal levels through these circuits, dynamic range control is required.

Without some form of dynamic range control for electric music instrument amplifiers, typical active circuit components such as operational amplifiers and transistors can clip signal peaks and cause undesirable distortion. Distortion created by this type of clipping typically contains high levels of odd order harmonics (i.e., 3rd, 5th, 7th . . .), which are considered by many to be harsh sounding and generally unacceptable if excessive levels are allowed.

One known method of dynamic range control is to use simple voltage dividing circuits or variable resistors to adjust incoming signals so that the maximum levels expected do not exceed certain predetermined limits. These circuits are usually adjusted only once. However, much of the available headroom is only used during signal transients. This results in low average signal levels and overall signal to noise ratios that are less than desirable.

Another method is to limit peak signal excursions by using diodes or transistors placed in the circuit in such a way that when signal peaks reach a certain level signals are limited from going any higher. This limiting action keeps signal peaks away from amplifier nonlinearities and clipping levels. However, such limiting action can be abrupt and create high levels of odd order harmonic components, and an acceptable level of dynamic range control without excessive distortion may be difficult to achieve in practice.

Automatic gain control (AGC) circuits are also common in the art for use with electric musical instrument amplifiers. Such AGC circuits use variable gain and level sensing circuits that set circuit gain according to signal level. Such circuits can be effective and solve the problem of low average signal levels of the previous methods, but because much of the uniqueness of different musical instrument sounds is contained within the transients and peaks and valleys of the signal produced by these instruments, the individuality of instrument and player tends to be eliminated by using AGC devices, thereby tending to make many instruments sound somewhat the same. Furthermore, the basic AGC circuit building blocks can be relatively complex and costly. AGC circuits also usually have fixed attach and release times which further restricts the individual tonal quality of the instrument.

It is also known to use nonlinear circuits to introduce a controlled amount of distortion for obtaining a desired harmonic content as discussed in two publications by Richard A. Shaeffer entitled "Electronic Musical Tone production by Nonlinear Waveshaping" in Volume 18, Number 4 of the Journal Of The Audio Engineering Society at pp. 413–416 (1970) and "Production of Harmonics and Distortion in p-n Junctions" in Volume 19, Number 9 of the Journal Of The Audio Engineering Society at pp. 759–768 (1971).

Other examples of peak limiting, clamping, and compression circuits are generally shown in U. S. Pat. Nos. 3,509,373; 3,986,049; 3,548,323; 4,119,922; and 4,349,788.

SUMMARY OF THE INVENTION

Briefly described is a dynamic range control system, in accordance with a presently preferred embodiment of the invention introduced, a circuit for use with electric musical instruments is provided. A compressor circuit is included with an operational amplifier having compressing means both on the input side and in the feedback loop. Each compressing means includes two oppositely connected back to back diodes operated in the forward conducting region of the diode characteristics, but unlike prior art devices, operated primarily in the nonlinear region of the diode forward characteristic. In this manner, a controlled amounts of distortion is introduced to produce a more pleasing sound.

In accordance with a feature of the invention, the output of the compressor circuit can be passed through a series combination of a narrow bandpass filter, a high gain limiter, and a low Pass filter for creating a relatively highly compressed, harmonically complex, distorted sound most frequently used in "hard rock" music.

Pursuant to another aspect of the present invention, there is provided a notch filter of the type having a low pass filter and a high pass filter connected in parallel to a summing means. A level controlling means placed in series with the high pass filter varies the signal inputted to the high pass filter. The frequency response at the summing means will have a notch at the mid-frequency range. The reduction of the mid-frequency range produces a more uniform frequency response with improved sound quality.

In accordance with another feature of the invention, a plurality of bandpass filters in parallel in the signal path that provide greater operator frequency preemphasis control.

Time delay circuitry can also be provided optionally for creating musical sound effects.

BRIEF DESCRIPTION OF THE DRAWINGS

FIG. 3 is a schematic circuit diagram of the bandpass filter, high gain limiter, and low pass circuits of FIG. 1.

FIG. 16 is a circuit diagram of the notch filter shown in FIG. 14.

FIG. 17 is a block diagram of the notch filter circuit shown in FIG. 16.

FIGS. 18A and 18B are plots of the frequency response of the circuit of FIG. 16 with the control potentiometer at minimum and maximum settings, respectively.

FIG. 19 is a schematic diagram of a low pass filter circuit similar to the low pass circuit shown in FIG. 3 in which a low boost circuit is used.

FIG. 20 is a plot showing the frequency response of the low pass filter circuit shown in FIG. 19.

DETAILED DESCRIPTION OF THE PREFERRED EMBODIMENT

Figure 1:
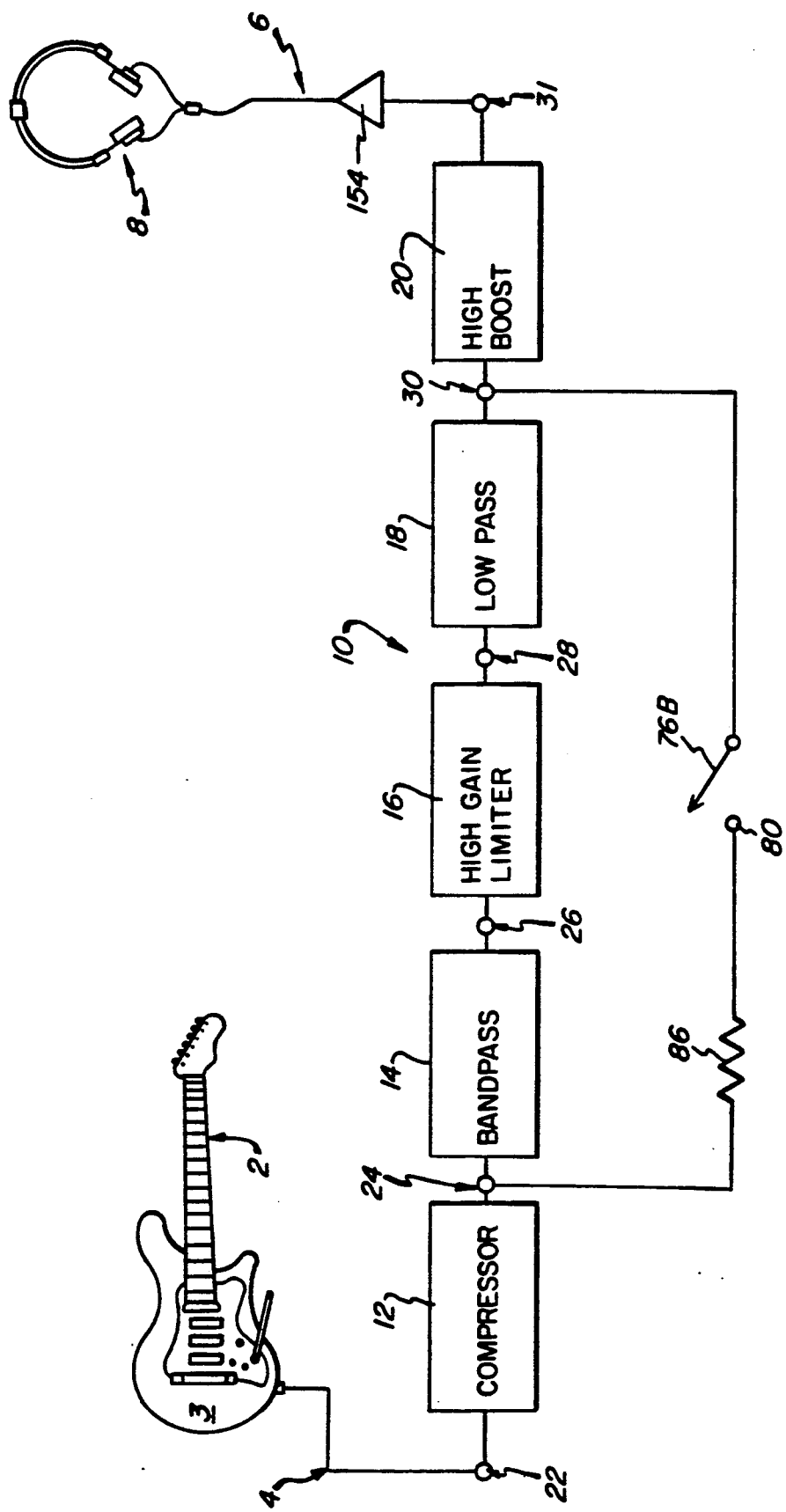
FIG. 1 is a block diagram of a presently preferred embodiment of a dynamic range controlled of amplifier system in accordance with the present invention.

With reference to FIG. 1, an electric guitar 2 is shown connected by lead 4 to the system 10 of the present invention, which preferably comprises the compressor circuit 12 of the present invention. If switch 76B, which is further described below, is open as shown in FIG. 1, then the circuit 10 of the present invention also includes bandpass filter circuit 14, high gain limiter circuit 16, and low pass filter circuit 18. If switch 76B is closed, then filter 14, limiter 16, and filter 18 are effectively removed from circuit 10. High boost circuit 20 and power amplifier circuit 154 complete system 10. Each of these individual circuits is discussed in further detail below. The output of system 10 is connected via lead 6 to a set of headphones 8. System 10 is preferably housed within a rigid body for attachment directly to the body 3 of guitar 2 as described in the patent applications referenced above.

Figure 2:
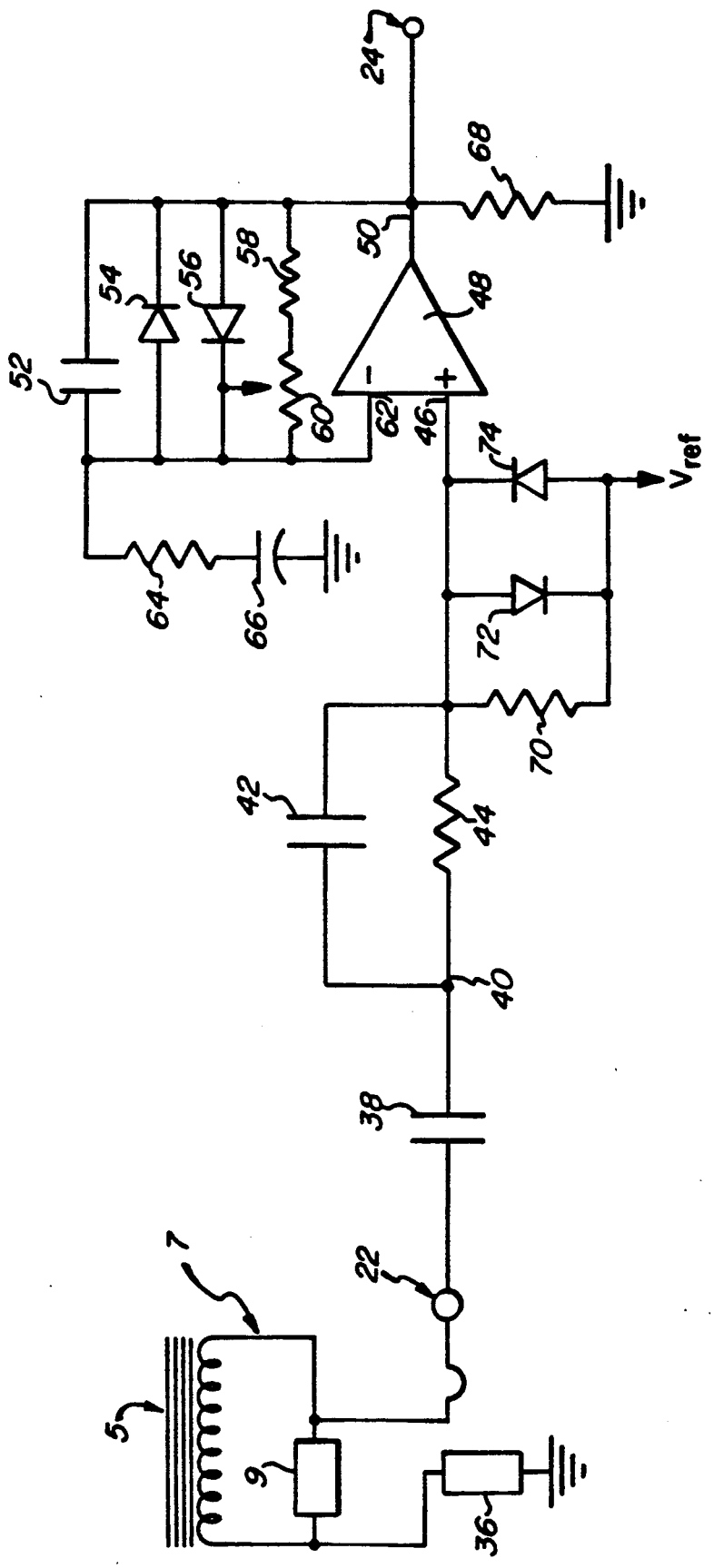
FIG. 2 is a schematic circuit diagram of the compressor circuit of FIG. 1.
Figure 4:
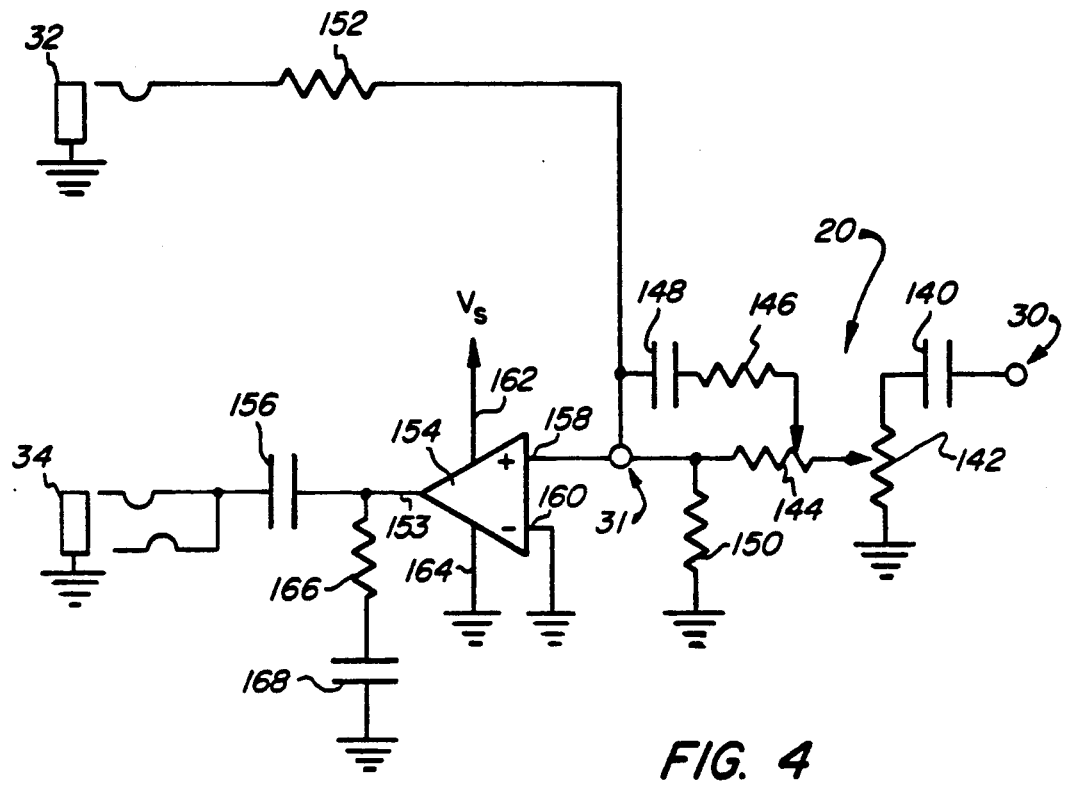
FIG. 4 is a schematic circuit diagram of the high boost circuit and power amplifier circuit of FIG. 1.

Turning now to FIG. 2, numeral 22 indicates the input terminal to the circuit 10 of the present invention. Terminal 22 receives its electrical signal input from a routine transducer 5, such as a well known electric guitar pickup having at least one coil 7 for generating an electrical signal having an amplitude that typically ranges from 0–1.0 volt RMS, through a connector such as jack 36. Transducer 5 also includes conventional control circuitry indicated generally at 9, the details of which form no part of the present invention. Terminal 22 is connected through capacitor 38 to junction 40, which is connected to a parallel combination of capacitor 42 and resistor 44. This parallel combination is connected to terminal 46, which is the non-inverting input of operational amplifier 48. Operational amplifier 48 may be any suitable amplifier circuit, such as for example LM 358 manufactured by National Semiconductor. Such operational amplifiers typically have an input port or noninverting input indicated by (+), a feedback port or inverting input indicated by (−), and an output port or terminal. It is understood that the operational amplifiers shown in FIGS. 2 through 4 are routinely connected to standard voltage supplies such as for example $V_{ref}$ and $V_s$ as indicated in FIGS. 2 through 5, even though the actual connections are not shown. The power supply will be discussed in further detail below with respect to FIG. 5.

The output terminal 50 of operational amplifier 48 is connected to junction 24. Terminal 50 is also connected through a feedback loop comprising the parallel combination of capacitor 52, oppositely connected semiconductor diodes 54 and 56 in parallel, and series resistors 58 and 60 to the inverting input 62 of operational amplifier 48. Terminal 62 is connected to ground through resistor 64 and capacitor 66. Output 50 of operational amplifier 48 is connected to ground through resistor 68, and terminal 46 is connected to $V_{ref}$ through the parallel combination of resistor 70 and connected parallel semiconductor diodes 72 and 74.

An important feature of the compressor circuit 12 of the present invention is that the oppositely connected diode pair 72 and 74 connected to non-inverting input 46 and the oppositely connected diode pair 54 and 56 connected in the feedback loop to the inverting input 62 are arranged to operate primarily in the nonlinear region of each diode's forward characteristics, which is for silicon between approximately 0 and 0.7 volt.

Figure 2A:
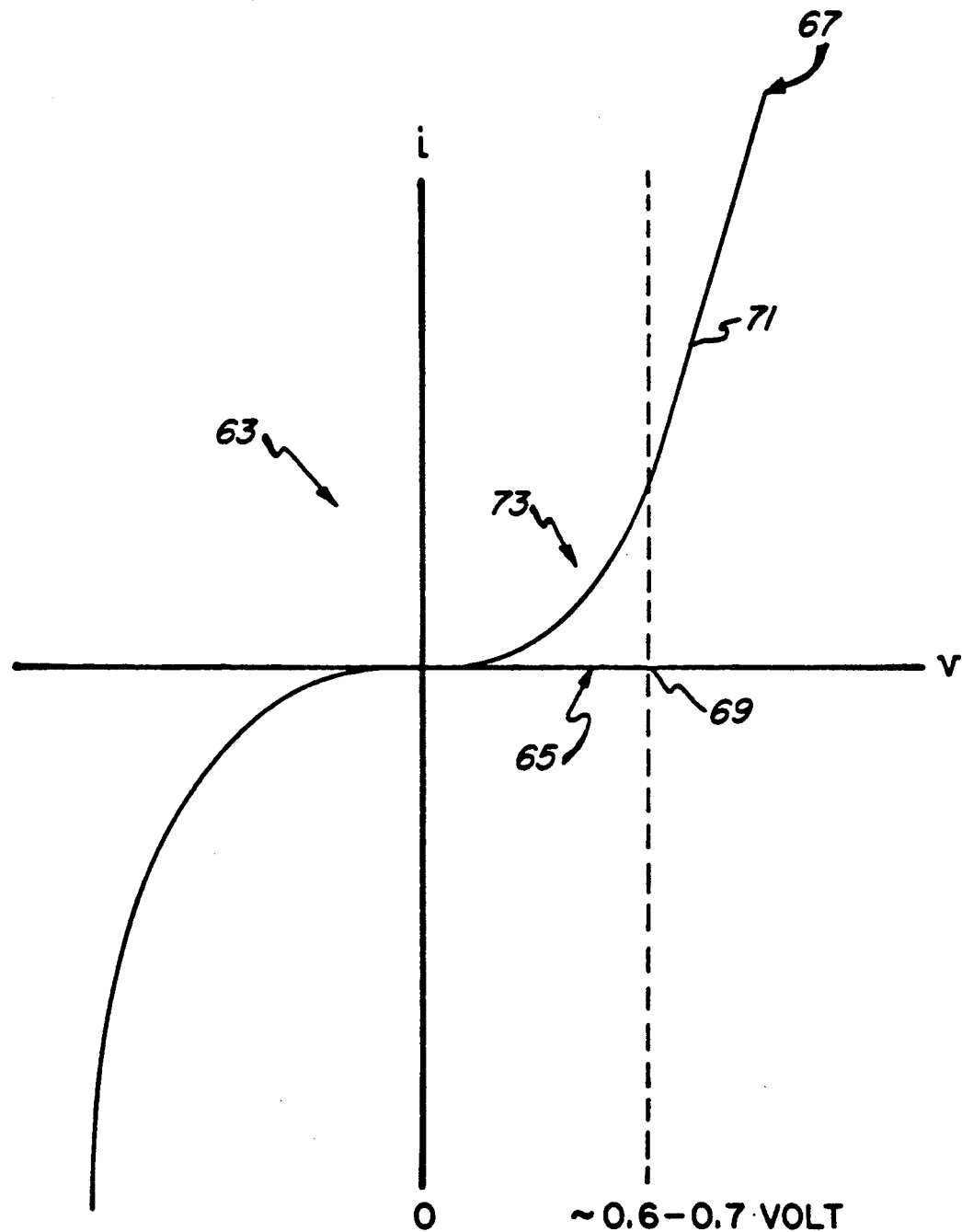
FIG. 2A is a plot of the conduction characteristic curve of the diode pairs shown in FIG. 2.

The forward biased current voltage characteristics of p-n junctions, such as for example silicon diodes, are well known as illustrated by plot 63 of instantaneous current i versus voltage v in FIG. 2A. As forward voltage v is increased from 0 to some positive value as indicated along abscissa 65, forward resistance, which is represented by the inverse slope of curve 67, decreases until the diodes' forward voltage drop is approximately 0.60–0.70 volt, as shown by dotted line 69. At and beyond this dotted line 69 but less than breakdown voltage, the diode is considered "on" and the forward resistance is essentially constant and less than about 1.0 ohm as represented by the essentially straight portion 71 of curve 67. Most prior art limiting circuits for musical instruments are designed to operate in this "on" region.

However, the circuit of the present invention is designed to operate primarily in the nonlinear region 73 of the diodes' forward characteristic between about 0 and 0.70 volts. In this region the diode acts as a voltage variable resistor, as represented by the varying slope of curve 67 in region 73. Because the diodes 72 and 74 are set up as the shunt elements in a voltage divider circuit comprising resistors 44 and 70 and capacitor 42, the signal wave form from the coil 7 is modified nonlinearly in that as the amplitude of the signal at terminal 22 increases, the shunt resistance seen at terminal 46 decreases. When the diode shunt resistance approaches that of resistor 70, input signal level begins to be controlled by diode forward resistance with amplifier output being reduced nonlinearly with increased signal amplitude. High peak excursions of the input signal will be limited to +0.70 volt in a manner similar to that of limiting circuits. In this way the dynamic range of the input signal is controlled (reduced).

Input capacitor 38 sets the low frequency response of the circuit and AC couples the input signal from coil 7 to the remainder of the circuit. Resistors 44 and 70 in combination with capacitor 42 are important for conditioning the desired portion of the input signal to operate primarily in the nonlinear region 73 of the shunt diodes 72 and 74 forward characteristic. The values of resistor 44 and resistor 70 can be varied from instrument to instrument to get the input signal to swing through the proper voltage range. For an electric guitar, the preferred voltage divider ratio of the resistance value of resistor 70 to the sum of the resistance values of resistors 70 and 44 is about 0.25, which is given by setting resistor 44 to 1MΩ and resistor 70 to 300KΩ. Other ratios, such as in the range of about 0.1 to 1.0 can be used depending on the effect desired and instrument used.

Diode 72 operates during positive excursions of the input signal while diode 74 operates during the negative cycles. For low level signals the forward resistance of diodes 72 and 74 is high relative to resistor 70. Therefore the signal passes through to operational amplifier 48 relatively unaffected by the shunt action of the diodes. As the signal level is increased, the diodes' shunt resistance begins to decrease, thereby reducing circuit gain and compressing signal dynamic range. Capacitor 42 is used for high frequency preemphasis, which may or may not be desirable depending on the source instrument and the tonal response desired. The diode action is significant in maintaining the tonal character of the specific musical instrument being used.

Accordingly, capacitor 42, resistors 44 and 70, and diode pair 72 and 74 act as a first compressor means for compressing the signal input at 22 by compressing signal amplitude changes as the signal is applied to terminal 46. The compressed signal at 46 is therefore a nonlinear function of the input at 22 and is coupled to the positive or non-inverting input of operational amplifier 48. It is also understood that the first compressor means could be repeated in series to provide successive stages of compression.

The basic gain of the amplifier 48 is set by resistors 58, 60, and 64. Gain can be manually adjusted by manually operable variable resistor 60 to provide amplifier input level control so that the feedback signal again operates primarily in the nonlinear region of feedback diodes 54 and 56. In practice resistor 70 or 44 can also be made user adjustable so that optimum setting can be made for the particular instrument/player combination being used. Because the resistance of diodes 54 and 56 varies as a nonlinear function of the output signal, capacitor 52, diodes 54 and 56, and resistors 58 and 60 have a variable feedback impedance providing a second compressor means for compressing the output signal even further by reducing amplifier gain in response to increased amplifier output at 24.

An important feature of the present amplifier is that as amplifier input signals at 46 are increased, amplifier gain is reduced by the action of diodes 54, 56 and the feedback loop to approach a minimum value of unity for the noninverting amplifier configuration used. Unlike the first compressor means, which limits peak excursions to 0.7 volts, the second compressor means including capacitor 52 and diodes 54 and 56 as part of the feedback loop for operational amplifier 48 reduces the gain, but to no less than unity. This feature further helps to retain some of the tonal individuality of the instrument, because signal transients compressed by the first compressor means are not clipped or "hard" limited by diodes 54 or 56, which would create unwanted distortion, but instead are allowed to pass at no less than unity gain while low level signals little affected by first compressor means are amplified relative to these peaks to further reduce overall signal dynamic range.

Capacitor 52 is used to reduce high frequency noise and to attenuate any higher order harmonics present.

The resultant wave form at the output 24 of amplifier 48 is a compressed version of the input at 22, with low level signals being passed through with relatively little alteration to tonal quality and higher levels being increasingly attenuated with additional subtle harmonic content.

By operating Primarily in the nonlinear region, compressor circuit 12 compresses the dynamic range of a widely varying AC waveform and has a resultant distorted wave form having improved and more pleasing sound, believed to be caused by increased even order harmonic content. This is of particular advantage to electronic stringed musical instruments because the addition of even order (2nd, 4th, etc.) harmonics to the signal is generally believed to be either unnoticed or considered a welcome addition as long as the fundamental frequency domain characteristics of the original signal are left intact.

Depending upon the setting of switch 76 as described in further detail below, the signal output from compressor 12 at terminal 24 can be applied to the bandpass filter 14, high gain limiter 16, and low pass filter 18 as described hereinafter.

FIG. 3 shows the bandpass filter circuit 14 of FIG. 1 between junctions 24 and 26; the high gain limiter circuit 16 of FIG. 1 between junctions 26 and 28; and the low pass filter 18 of FIG. 1 between junctions 28 and 30. Junctions 24, 26, 28, and 30 of FIG. 3 of course correspond to like junction numbers in FIGS. 1, 2, and 4 and so on.

With reference now to FIG. 3, switch 76 is shown in two parts as switches 76A and 76B ganged together as indicated by dotted line 78. The setting of switch 76 establishes whether circuit 10 of FIG. 1 is in a state corresponding to switch setting 80, setting 82, or setting 84, which corresponds to the settings "clean" or little distortion; "edge" or subtle distortion, and "heavy metal" or substantial distortion, respectively as hereinafter described.

If switch 76 is in the "clean" position or position 80 as it happens to be in FIG. 3, the signal output from compressor 12 is fed directly through resistor 86 to the high boost and power amplifier circuits of FIG. 4, thereby bypassing bandpass filter 14, high gain limiter 16, and low pass filter 18.

If switch 76 is in either position 82 or 84, the signal at 24 passes through bandpass filter 14, high gain limiter 16, and low pass filter 18 before reaching the high boost and power amplifier circuits of FIG. 4.

With reference now to FIG. 3, bandpass filter 14 is for preemphasizing a selected portion of the instrument's output frequency spectrum. This is a common bandpass circuit known as a multiple feedback bandpass filter. Filter 14 includes resistor 88 for feeding the signal through capacitor 90 to the inverting input 91 of operational amplifier 92, the output of which is connected to $V_{ref}$, and the output is also grounded through resistor 104.

The bandpass filter 14 is designed to have a resonant frequency in the range of about 300 Hz to about 3,000 Hz, preferably about 985 Hertz, and a Q in the range of 0.5 to 3.0, preferably about 1.6 for use with electric guitar. Filter 14 therefore has an amplitude response such that the desired frequency preemphasis is applied to the high gain limiting stage to achieve the desired broad-band harmonic content and tonal character. The bandpass circuit 14 could be set up with other response shapes depending on the particular effect or sound desired. In practice filter 14 could be made variable to accommodate different guitars or for adjustment to an individual musician's taste.

After passing through bandpass filter 14, the signal now passes through a high gain limiting stage 16 to produce a relatively high distorted, long sustain signal at 28. Capacitor 106 couples the limiting circuit 16 to junction 26. Resistor 108 is connected to the inverting input 109 of operational amplifier 111. The parallel combination of capacitor 110, back-to-back oppositely connected diodes 112 and 114, and resistor 116, comprise a feedback loop from operational amplifier output 113 back to inverting input 109. Output 113 is also connected to ground through resistor 115. Non-inverting input 117 is connected to $V_{ref}$. Resistors 108 and 116, capacitors 106 and 110, diodes 112 and 114, and operational amplifier 111 comprise a relatively high gain limiting stage, with diodes 112 and 114 being operated substantially in the linear or "on" region of the diode forward characteristics.

Amplifier 111 is preferably designed to have a gain of about 212 volts/volt for use in the substantial distortion mode setting 84 of switch 76, as opposed to about 9.6 volts/volt in the edge mode setting 82 of switch 76. Amplifier 111 has a low frequency corner of about 338 Hz in the distortion mode; 691 Hz in the edge mode; and a high frequency rolloff beginning at about 723 Hz, so that desired distortion level and harmonic content are achieved with proper signal sustain.

The high gain limiter 16 works in conjunction with the bandpass filter 14 to create a specific harmonic content and tonal character in the following way. Signals in the bandpass of filter 14 are amplified by limiter 16 to a high enough level so that diodes 114 and 112 are operating in the linear or full "on" region over a wide range of input amplitudes (212 v/v amplifies 0.003 volts peak or 0.006 volts peak-to-peak up to limit). Signals in this frequency region are substantially distorted with peak to peak amplitudes limited to approximately ±0.7 V peak (1.4 V peak-to-peak). This limiting action introduces substantial harmonic distortion of all orders. Therefore, in the pass band, signals are "hard limited" producing a significant content of odd as well as even order harmonics.

By contrast, signal frequencies above and below the pass band of filter 14 are amplified by limiter 16, but because the amplitudes of these signals become smaller and smaller as the frequencies are further removed from the pass band signals, diodes 112 and 114 are driven thereby to a lesser degree. Therefore, depending on the specific frequency, diodes 112 and 114 can be operated in all regions of the diodes' forward characteristic. By contrast to pass band signals, which are substantially distorted as explained above, harmonic distortion of frequencies above and below pass band signals becomes less and less the further from the pass band frequencies the signal becomes. Out of band signals are distorted to an increasingly less degree operating more and more in the nonlinear region of the diodes' characteristic. These output signals display gently rounded as opposed to sharp corners. Sharp corners are believed to indicate the presence of odd order harmonics.

After passing through stage 16, the signal is fed through low pass filter 18 to reduce high frequency harmonic content and noise levels. Output 113 of operational amplifier 111 is connected through the voltage dividing pair of resistors 118 and 120 to the non-inverting input 122 of operational amplifier 124, the output 126 of which is connected, for switch position 84, through resistor 138 of switch 76 to junction 30. Output 126 is also connected directly to the inverting input 130 of operational amplifier 124, which inverting input is also coupled by capacitor 131 to the junction 29 between resistors 118 and 120. Non-inverting input 122 is connected to $V_{ref}$ through capacitor 132. Output 126 is also grounded through resistor 134. Terminals 135 and 137 of operational amplifier 124 are connected to V5 and ground respectively as shown.

Resistors 118 and 120, capacitors 131 and 132, and operational amplifier 124 comprise a second order Chebechev 1dB ripple low pass filter with a corner frequency in the range of about 200–4,000 Hz, preferably 3,000 Hz, which filters out the higher harmonics which are generally responsible for harsh or gritty sound of signals emitting from amplifier 111. This filter is effective in reducing the substantial higher order harmonic content created by limiter 16 in combination with the preemphasis action of filter 14.

When switch 76 is set in position 82, the capacitor 94 and resistor 96 are switched into the circuit 14 to provide decreased gain for limiter 16. Accordingly, in this switch position a small resistor 128 replaces resistor 138 to compensate for the decreased signal level. This changes the signal so that the distortion introduced by limiter 16 is much less, primarily distorting signal peaks giving an "edge" to the sound, with distorted signal peaks displaying rounded as opposed to sharp corners.

Turning now to FIG. 4, the high boost circuit 20 is shown between junctions 30 and 31. Circuit 20 is in essence a treble control for adjusting the degree of to output 153 and then through capacitor 156 to a connector such as jack 34, preferably for connection to headphones 8. Junction 31 is connected to the non-inverting input 158 of power amplifier 154, while the inverting input 160 is grounded. Terminals 162 and 164 of power amplifier 154 are connected to $V_s$ and ground respectively. Output 153 is also connected to ground through resistor 166 and capacitor 168.

Connector 32 is for an auxiliary input through resistor 152 for allowing an auxiliary signal to be superposed, such as for example from a tape player or other source with which the musician wishes to play along. This auxiliary signal at 32 sets up a voltage drop across summing resistor 150, which permits the signal from high boost circuit 20 to be summed therewith.

Figure 5:
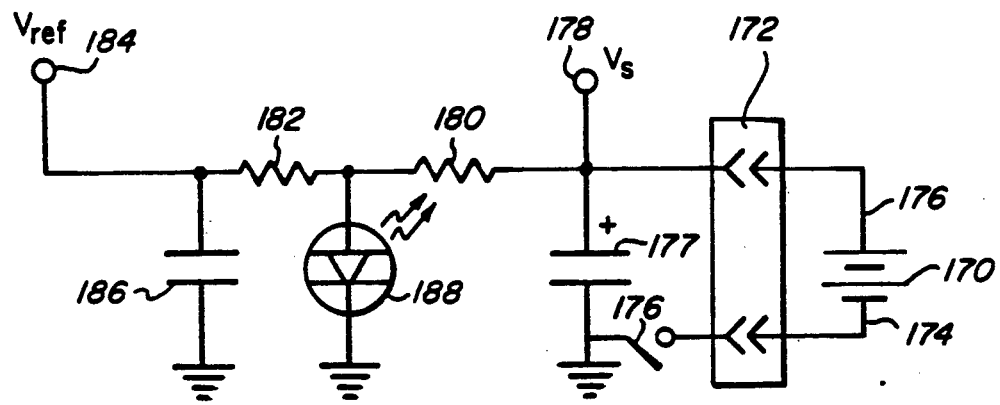
FIG. 5 is a schematic circuit diagram of the power supply circuitry for the circuit of FIG. 1.

FIG. 5 shows the preferred power supply for the circuit of the present invention. Battery 170 is preferably a 9 volt alkaline dry cell connected through a standard connector such as battery snap connector 172 to the circuit of the present invention. Negative terminal 174 is connectable through on-off power switch to ground to power-up the circuit. Positive terminal 176 is connected to terminal 178 for providing $V_s$ of approximately #9 volts for the various circuit elements as indicated above. Battery 170 is also connected through resistors 180 and 182 to terminal 184 for providing $V_{ref}$ of approximately #1.7 volts, which is coupled to ground by capacitor 186 for reducing noise and other undesirable stray signals. LED 188 provides a visual indication of when the circuit is "on". Resistor and capacitor 186 comprise a low pass filter to provide a stable $V_{ref}$ for circuit operation.

The following listing provides the values for the circuit of the preferred embodiment:

Resistors (all resistors are 1/8 W, 5%, carbon film)

| | | |
|---|---|---|
| 44 | 1MΩ | |
| 58 | 10KΩ | |
| 60 | 50KΩ | linear potentiometer |
| 64 | 6.8KΩ | |
| 68 | 6.8KΩ | |
| 70 | 300KΩ | |
| 88 | 15KΩ | |
| 96 | 100KΩ | |
| 98 | 160KΩ | |
| 104 | 6.8KΩ | |
| 108 | 4.7KΩ | |
| 115 | 6.8KΩ | |
| 116 | 1MΩ | |
| 118 | 120KΩ | |
| 120 | 120KΩ | |
| 128 | 2.4KΩ | |
| 134 | 6.8KΩ | |
| 138 | 15KL | |
| 142 | 10KΩ | logarithmic potentiometer |
| 144 | 50KΩ | linear potentiometer |
| 146 | 10KΩ | |
| 150 | 10KΩ | |
| 152 | 160KΩ | |
| 166 | 10Ω | |
| 180 | 3.0Ω | |
| 182 | 3.0KΩ | |

Capacitors

| | | |
|---|---|---|
| 38 | 2,200 | picofarads |
| 42 | 330 | picofarads |
| 52 | 1,000 | picofarads |
| 66 | 0.1 | microfarads |
| 90 | 3,300 | picofarads |
| 94 | 2,200 | picofarads |
| 100 | 3,300 | picofarads |
| 106 | 0.10 | microfarads |
| 110 | 220 | picofarads |
| S131 | 1,000 | picofarads |
| 132 | 270 | picofarads |
| 140 | 0.22 | microfarads |
| 148 | 3,300 | picofarads |
| 156 | 100 | microfarads, 10 V |
| 168 | 0.10 | microfarads |
| 177 | 4.7 | microfarads, 10 V |
| 186 | 4.7 | microfarads, 10 V |

Diodes

| | |
|---|---|
| 54 | 1N4148 |
| 56 | 1N4148 |
| 72 | 1N4148 |
| 74 | 1N4148 |
| 112 | 1N4148 |
| 114 | 1N4148 |
| 188 | HLMP 1700 |

Amplifiers

| | | |
|---|---|---|
| 48 | LM 358 | } Dual |
| 92 | LM 358 | |
| 111 | LM 358 | } Dual |
| 124 | LM 358 | |
| 154 | LM 386 | |

The operational amplifiers are standard chips connected to supply voltages, $V_{ref}$ and $V_s$, as indicated in the drawings. It is understood that any of the operational amplifiers could be replaced by routine and suitable amplifier circuitry, such as for example a transistor-based amplifier.

Figure 6:
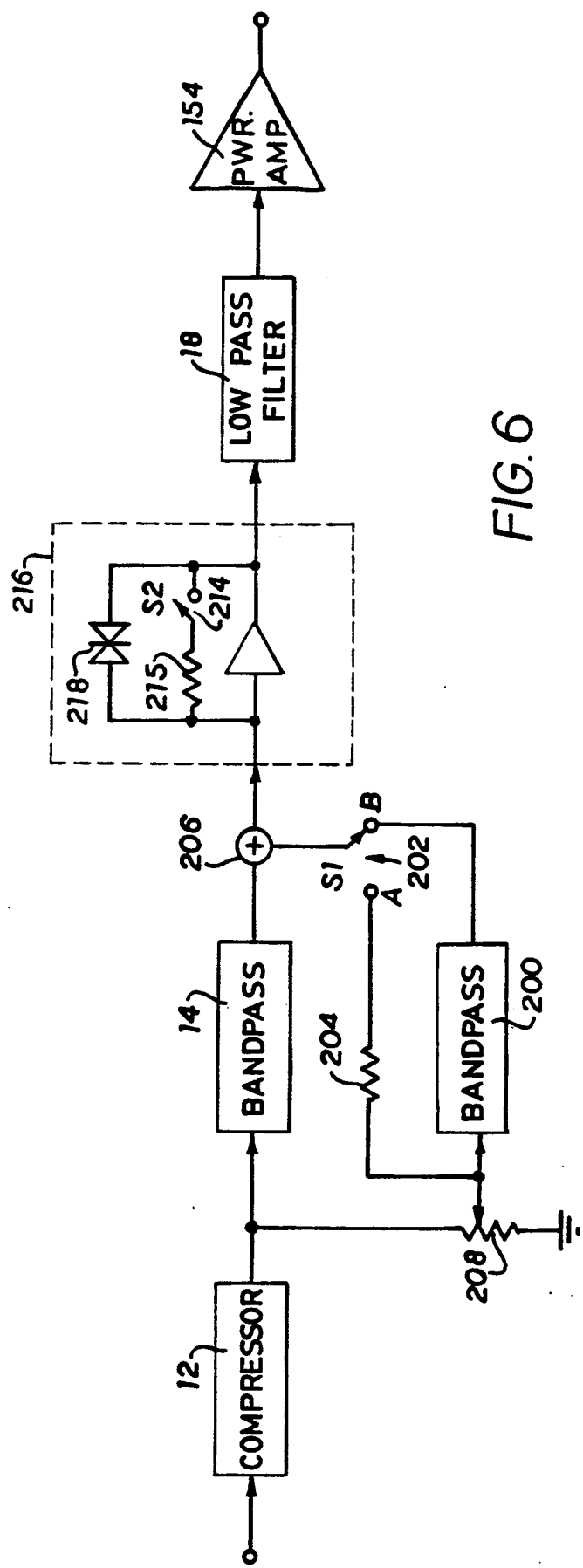
FIG. 6 is a block diagram of a dynamic range controlled amplifier system in accordance with a second embodiment of the present invention wherein two bandpass filters are connected in parallel.

FIG. 6 shows another embodiment of the system of FIG. 1, wherein a second bandpass filter 200, is connected in parallel with the first bandpass filter 14. Bandpass filters 14 and 200 are tuned to different frequency bands respectively. In this configuration, frequency preemphasis as described previously is under much greater control. Switch S1 at 202 alternately selects filter 200 or resistor 204, which in the preferred embodiment has a value of 100 KQ.

Figure 7A:
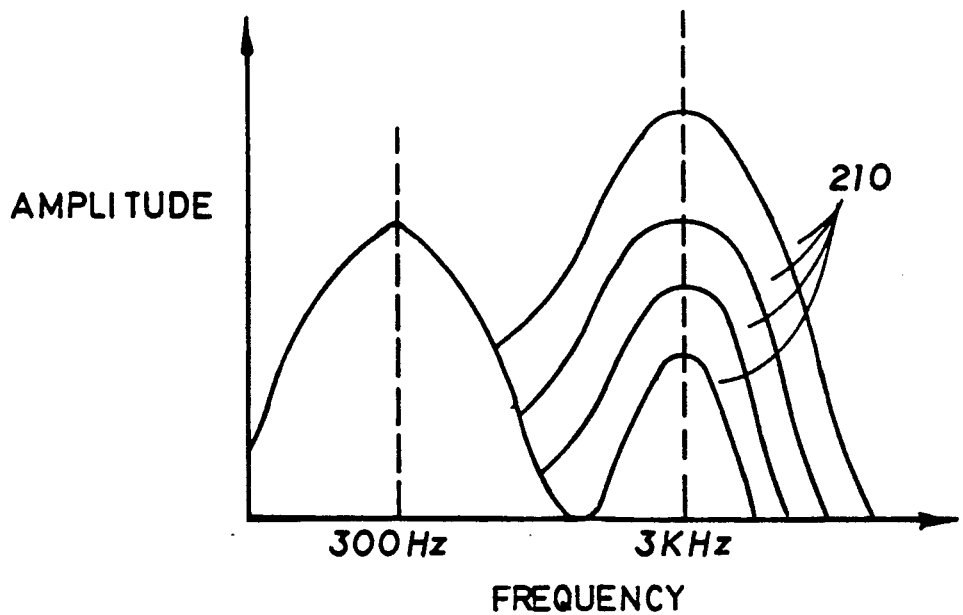
FIGS. 7A and 7B are plots generally describing output waveforms resulting from the operation of the system of FIG. 6.

With switch S1 in position B as shown in FIG. 6, the summing circuit 206 accepts inputs from filters 14 and 200 only. In this configuration the output of compressor 12 is split into two bands with the level of the band defined by filter 200 being adjustable by potentiometer 208 which in the preferred embodiment is a 50 KΩ potentiometer. In the current preferred embodiment the filters 14 and 200 are set up for use with electric bass guitar with the center frequency of filters 200 and 14 set at 300 HZ and 3 KHZ respectively. Control 208 adjusts the high frequency content of the mix at 206 by varying the input level to filter 200 as shown in the family of curves indicated generally at 210 in FIG. 7A. This circuit configuration produces a "bright" sound used for contemporary "pop & slap" style bass playing.

Figure 7B:
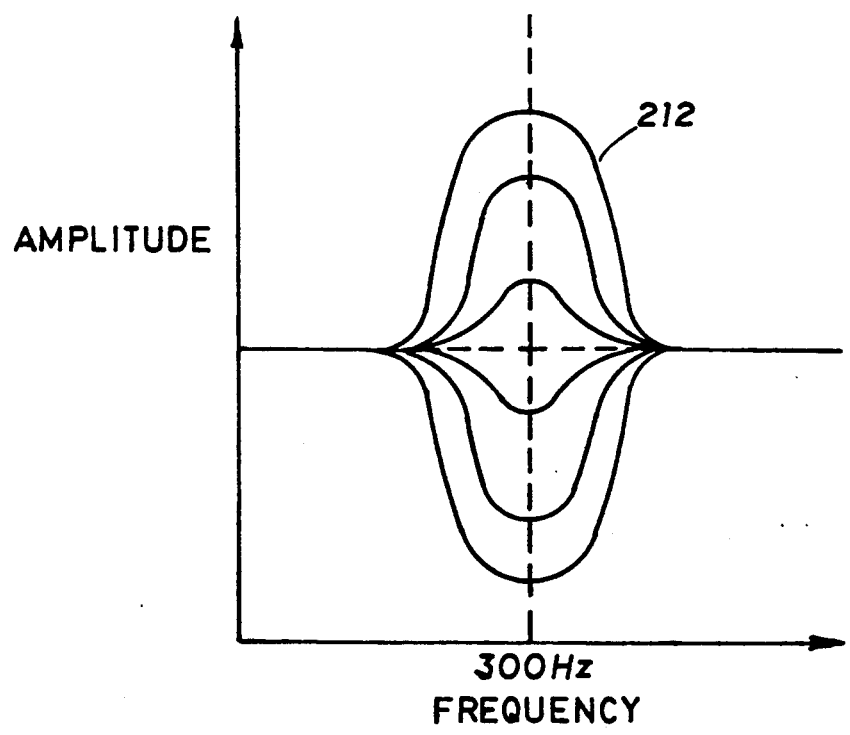

With switch S1 in position A the combination of resistor 204, filter 14, and mixer 206 form an equalizer circuit which allows emphasizing or deemphasizing a specific frequency range of the compressor output. By having a center frequency of 300 HZ, low frequencies can be either emphasized or deemphasized. In the present circuit the arrangement produces a "thick" low end sound used for traditional bass playing. Potentiometer 208 controls the relative low end boost either up or down as shown by the family of curves indicated generally at 212 in FIG. 7B. Other frequencies could be selected for different applications.

High gain limiter 16 is modified as shown by the circuitry inside dotted line 216. Switch S2 at 214 selects the gain of modified limiting amplifier 216 by coupling or decoupling resistor 215 with a preferred value of 100 KΩ. With S2 closed, gain is set low, and amplifier 216 acts as a normal amplifier with some compression of higher signal amplitudes due to the back to back diodes in the feedback loop. In this way a clean undistorted natural sound is achieved with improved harmonic content, without bypassing the distortion amp 16 with switch 76B as described above. When S2 is open, amp 216 acts as a high gain limiter as before and substantially distorts the input signal.

In the present circuit the high boost circuit 20 of FIG. 1 has been eliminated because of the high frequency compensation allowed by potentiometer 208.

Filter 18 contains at least one low pass section to compensate for any undesirable characteristics generated by the limiting amplifier 216. Medium and/or high frequency compensation may also be desirable.

Figure 8:
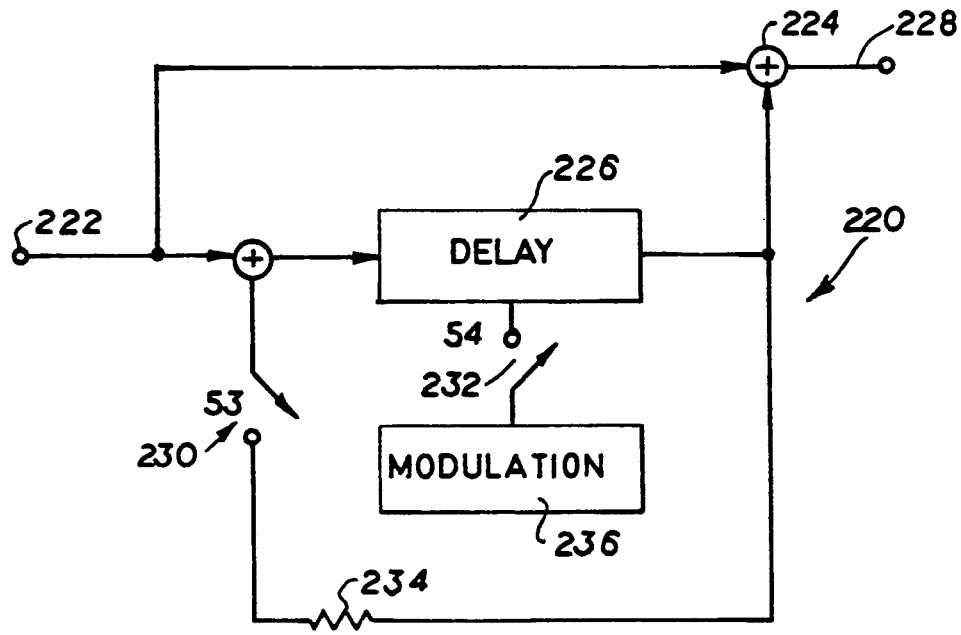
FIG. 8 is a diagram of a time delay circuit useful in systems in accordance with present invention.

Another preferred embodiment of the present invention which provides time delay effects can be generated by including the circuit 220 of FIG. 8 in series with the circuit of either FIG. 1 or 6. The circuit 220 of FIG. 8 is preferentially placed after the low pass filter 18 of FIG. 1 or FIG. 6 so that any noise generated by delay circuitry is not amplified by any subsequent high gain amplifier stages.

The input signal from 222 goes to two places, mixer 224 and delay line 226. The delay line 226 introduces a time delay to the signal preferably in the range of substantially about 1 to 60 milliseconds and is fed to mixer 224 to be recombined with the undelayed signal from 222. The output 228 of mixer 224 goes to further signal processing electronics or, as in the present invention, to the power amplifier 154 so the signal can be amplified to listening levels. Switches S3 at 230 and S4 at 232 in combination with feedback resistor 234 and delay modulation circuit 236 can be used to create common musical sound effects such as chorusing, doubling, flanging, and echo.

The delay modulation frequency for flanging and chorusing effects will preferably be in the range of substantially about 0.1 to 2 HZ, while feedback to input signal ratios set by the value of resistor 234 can be anywhere between 0 and about 0.9 depending on the effect desired. Mixer 224 can also be made variable so that the relative mix of delayed to undelayed signal can be adjusted.

Figure 9:
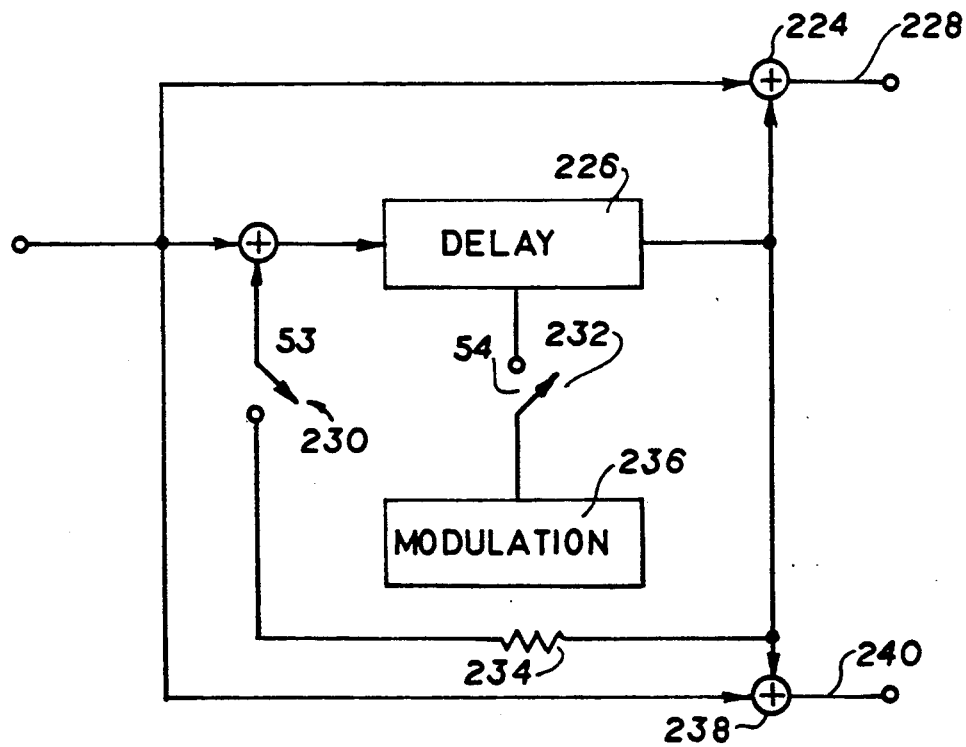
FIG. 9 is a diagram of a time delay circuit for creating a synthesized stereo effect.

As shown in FIG. 9, mixer 238 and output 240 have been added. In this circuit a synthesized stereo sound can be achieved. This sound is accomplished by having a substantially different mix of delayed to undelayed signal produced by mixers 224 and 238. In this way, for example, output 228 could contain a mix of predominantly delayed signal while output 240 predominantly undelayed signal, thus creating a stereo effect. Outputs 228 and 240 can then proceed to further signal processing electronics or to separate left and right power amplifiers (not shown) for amplification to listening levels.

Figure 10:
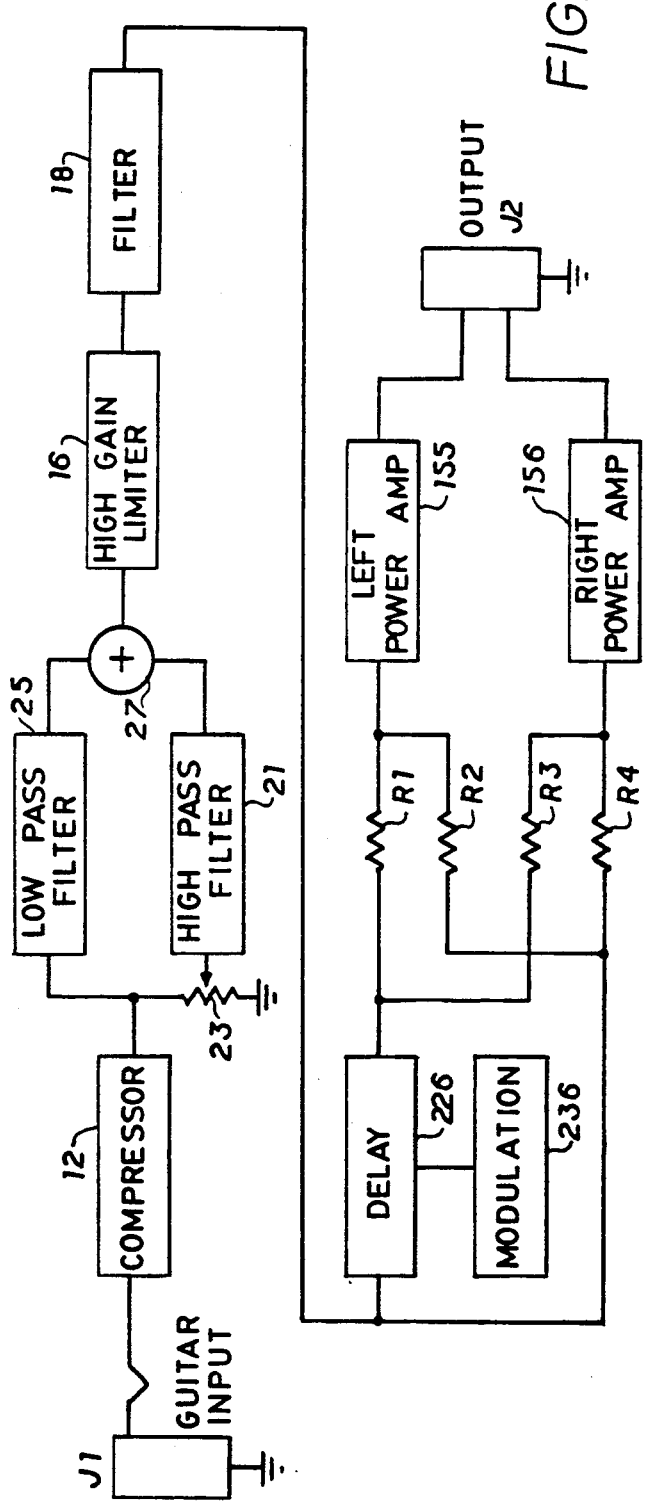
FIG. 10 is a block diagram of a dynamic range controlled amplifier system in accordance with a further embodiment of the invention in which a low pass filter and a high pass filter are substituted for the two bandpass filters shown in FIG. 6.
Figure 11:
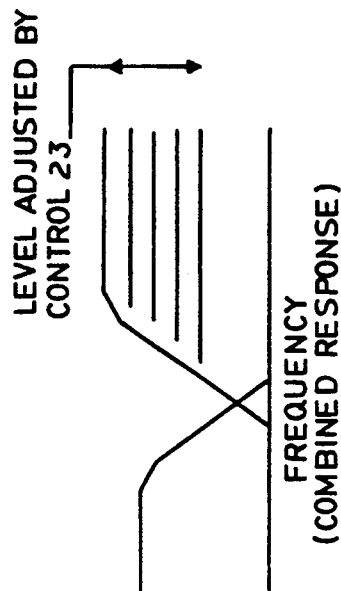
FIG. 11 are Plots of the frequency response of the system of FIG. 10.

Referring to FIG. 10 a low pass filter 25 and a high pass filter 21 are connected in parallel and substitute for bandpass filters 14 and 200 of FIG. 6. In this configuration, compressor 12 outputs a compressed signal which is split and sent to the low pass filter 25 and to the high pass filter 21. A level controlling means 23 (a potentiometer) is placed in series with the high pass filter to vary the level of the compressed signal inputted through the high pass filter. A summing circuit 27 receives the signals generated from both the low pass filter and the high pass filter. Low pass filter 25 and high pass filter 21 are tuned to have different cutoff frequencies which are spread apart enough so that there will be a notch in the frequency response at the summing circuit 27 as shown in FIG. 11. In the current preferred embodiment, the low pass filter and high pass filter are set to have cutoff frequencies of 250 Hz and 3000 Hz, respectively. The potentiometer 23 adjusts the high frequency content of the mix at the summing circuit 27 by varying the level of the inputted signal to the high pass filter 21.

FIG. 11 shows the frequency response for the signal at the low pass filter 25, high pass filter 21, and the combined response at the summing circuit 27. FIG. 11 also shows how the width, depth, and location of the frequency notch may vary as the potentiometer 23 is adjusted. The ability to change the frequency notch allows a person to obtain many different sound effects.

After passing through the summing circuit 27, the signal passes through the high gain limiting stage 16 to produce a relatively high distorted and long sustained signal. This limiting action introduces substantial harmonic distortion of all orders. As before, switching means similar to 214 of FIG. 6 or 76 of FIG. 1 can be used to change the gain of the limiter stage 16.

Next, the signal is fed through low pass filter 18 to reduce the high frequency harmonic content and noise level. Filter 18 is effective in reducing the substantial higher order harmonic content created by limiter 16 and the parallel combination of the low pass filter 25 and high pass filter 21.

After the low pass filter, the signal is fed to delay means 226 which was described hereinbefore and shown in FIGS. 8 and 9. Then the signal is sent, through resistors R1, R2, R3, and R4, to a left power amplifier 155 and a right power amplifier 156 so that the signal can be amplified to listening levels at output 32.

For low cost electric guiter applications, the circuit of FIG. 10 can be simplifed by eliminating low pass filter 25, control 23, and summing circuit 27, thereby connecting compressor 12, high pass filter 21, and high gain limiter 16 in series. For added user control, high pass filter 21 can be made variable between a range of 400 and 4000 hertz.

Figure 12:
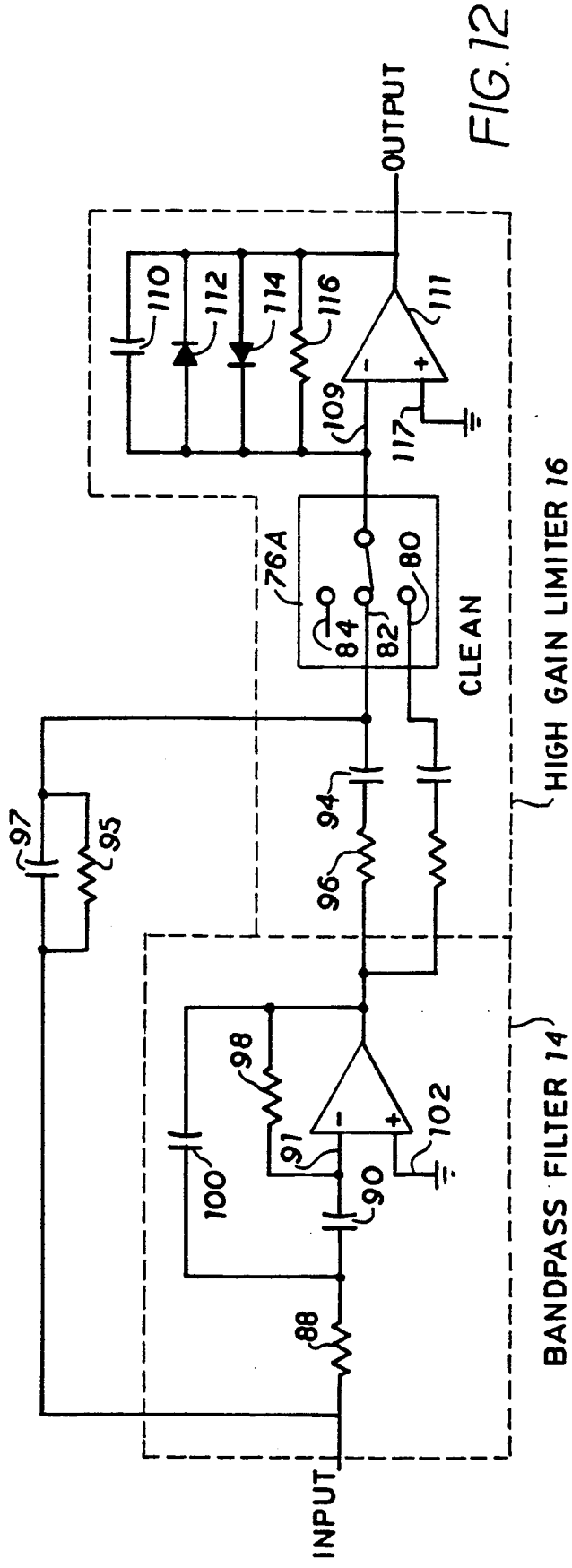
FIG. 12 is a schematic diagram of a compressor circuit similar to the circuit of FIG. 2 with another form of bandpass filter.

FIG. 12 shows another embodiment of the circuit shown in FIGS. 1 and 3 wherein the bandpass filter 14 and high gain limiter 16 have been modified with a capacitor 97 and resistor 95. Capacitor 97 and resistor 95 are connected in parallel and positioned in a feed forward path between the input to bandpass filter 14 and the input to high gain limiter 16. The parallel connection of capacitor 97 and resistor 95 allows the low and high frequency regions of the bandpass to be modified. Resistor 95 and resistor 116 set the low frequency gain while capacitor 97 and capacitor 110 set the high frequency gain. The addition of resistor 95 and capacitor 97 increases the capacity of bandpass filter 14 to specifically preemphasize a greater portion of the instrument s output frequency spectrum. As a result, the user will have better control over the distortion components generated.

Figure 13:
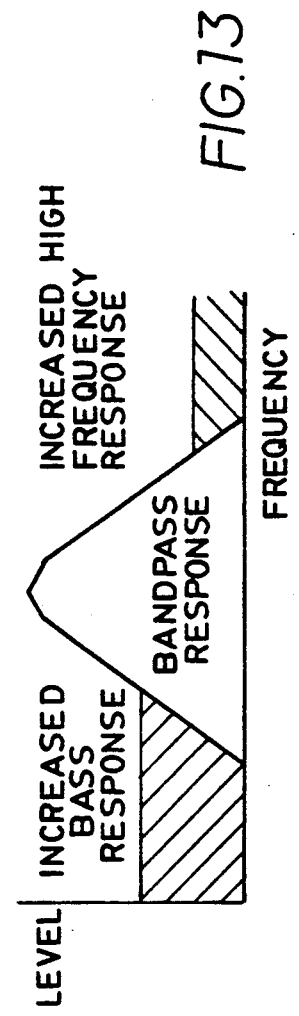
FIG. 13 is a plot showing the frequency response of the circuit of FIG. 12.

Preferably, resistor 95 should be 180 kΩ and capacitor 97 should be 1000 pf. However, the resistance of resistor 95 may be made variable in order to vary the gain outputted by amplifier 111. Thus, the variable resistor can provide more control for the user. FIG. 13 shows the modified frequency response that bandpass filter 14 will have with the addition of resistor 95 and capacitor 97 coupled in parallel.

Figure 14:
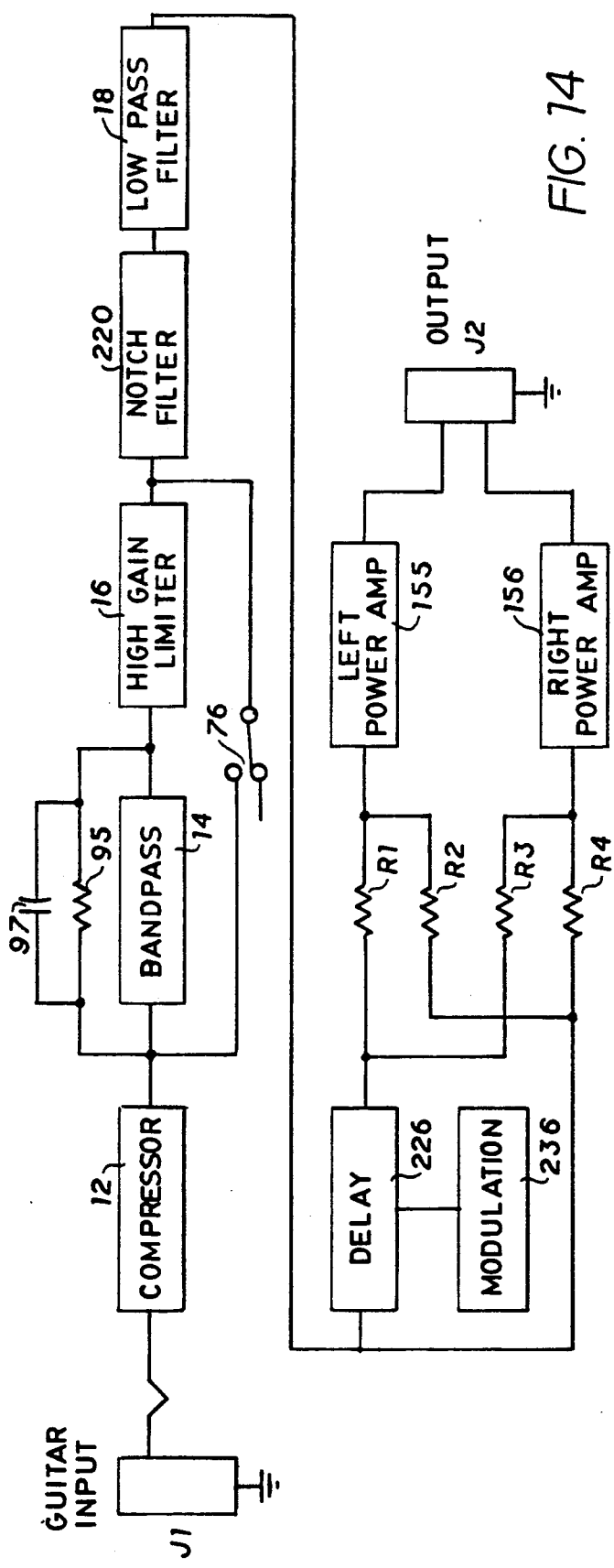
FIG. 14 is a block diagram of a dynamic range controlled amplifier in accordance with a still further embodiment of the invention wherein the switch is connected in a different location than in the system of FIG. 1 and a notch filter added.

FIG. 14 shows another system configuration wherein a bandpass filter 14 is used. In this configuration, switch 76 is connected after the high gain limiter 16 and not after the low pass filter 18 as shown in FIG. 1. Also, a notch filter 220 has been added before low pass filter 18. If switch 76 is in the "clean" position, the signal output from compressor 12 is fed directly to notch filter 220 and low pass filter 18, thereby bypassing bandpass filter 14 and high gain limiter 16.

Figure 15:
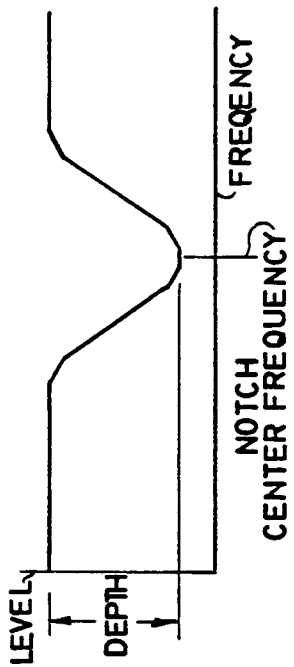
FIG. 15 is a plot showing the frequency response associated with the notch filter in the circuit of FIG. 14.

The notch filter provides an improved high and low frequency response by creating a frequency notch in the midfrequency range, as shown in FIG. 15. A notch in the frequency response will reduce heavy mid-range frequency content produced by bandpass filter 14 and high gain limiter 16. Therefore, there will be a more uniform frequency response with a much improved sound quality.

After passing through notch filter 220, the signal is outputted to low pass filter 18. The low pass filter 18 provides a high frequency roll off and will reduce higher order harmonic content and noise.

In this embodiment, bandpass filter 14 should have a center frequency that varies in the range of about 100 Hertz to about 10,000 Hertz. Low pass filter 18 shall have a cut-off frequency that varies in the range of about 500 Hertz to about 15,000 Hertz. Notch filter 220 should have a center frequency that varies in the range of about 100 Hertz to about 10,000 Hertz.

FIGS. 16 and 17 respectively show a circuit design and block diagram of notch filter 220 in series with low pass filter 18. Notch filter 220 includes a low pass filter 25, a high pass filter 21, a level controlling resistor 23, and a summing circuit 27. The signal outputted from high gain limiter 16 is inputted to notch filter 220 and split so that the signal is sent to both low pass filter 25 and high pass filter 21. The output of high pass filter 21 is sent through level control 23 and is combined with the output of the low pass filter 25 at summer 27. Level controller 23, a conventional potentiometer, adjusts the high frequency content at summer 27 by varying the output level sent to high pass filter 21. In this embodiment, high boost circuit 20 of FIG. 1 has been eliminated because of the high frequency compensation allowed by controller 23.

If low pass filter 25 and high pass filter 21 are tuned properly, a notch will be present in the frequency response as shown in FIGS. 18A and 18B. FIG. 18A shows the frequency response at the output of low pass filter 18 with controller 23 set at a minimum and FIG. 18B shows the frequency response with controller set at a maximum. The depth, width, and level of the frequency notch is a matter of design choice and can be modified to create the desired effect. In this embodiment, the preferred frequency notch is at 700 Hz with a depth of approximately 15 db, and a high frequency break point at about 2500 Hz.

Another implementation of the lowpass filter circuit of FIG. 3 is shown in FIG. 19. The addition of resistor 192 and capacitor 193 modifies the low pass frequency response so that relative low frequency boost can be obtained. The frequency response of the current preferred embodiment is shown in FIG. 20. The amount of low frequency boost and its corner frequency will depend on the desired effect and the tuning of the premphasis bandpass filter. The low frequency boost corner frequency will typically be between 60 and 600 hertz with boost of about 3 to 20 dB.

In this circuit the passband response of the low pass filter is modified so that low frequencies can be boosted. This circuit is suitable for use in all previous designs where additional low frequency response is required after the high gain limiter stage. In practice the low boost circuit can be located before or after the low pass filter stage.

Figure 21:
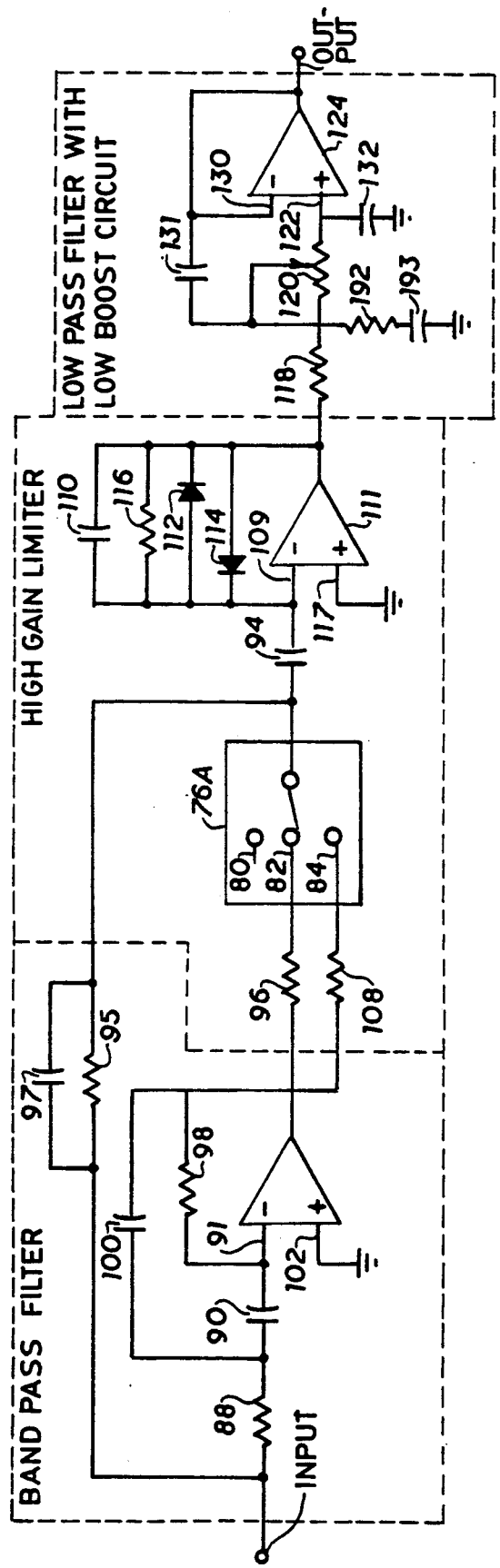
FIG. 21 is a schematic circuit diagram of the band pass filter circuit, the high gain limiter circuit, and the low pass filter circuit with the low boost circuit which may be used in the system of FIG. 1.
Figure 22:
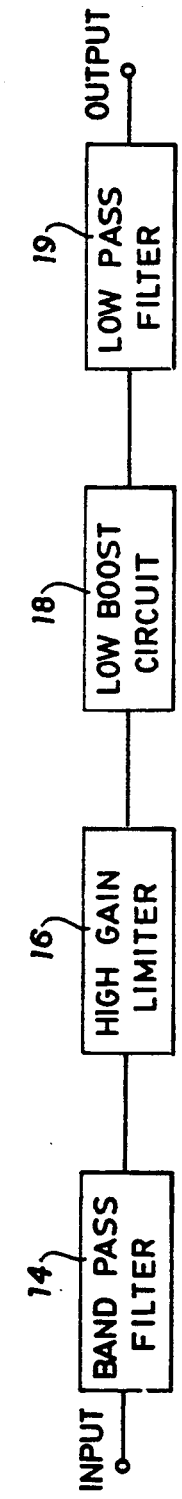
FIG. 22 is a block diagram of the system shown in FIG. 21.

The current application circuit is shown in FIG. 21 with block diagram shown in FIG. 22.

While specific values of voltages and components have been described, it is understood that such values are only exemplary and any equivalent values or set of values may be used which attain the described results.

It should be understood that various changes and modifications to the preferred embodiments described above will be apparent to those skilled in the art. Such changes and modifications can be made without departing from the spirit and scope of the present invention, and it is therefore intended that such changes and modifications be covered by the following claims.

I claim:

1. A system for processing electrical signals from at least one transducer associated with an electrified musical instrument, said system comprising:
   (a) bandpass filter system means operatively coupled to said transducer for receiving signals therefrom and passing therethrough a relatively narrow bandwidth of said signals;
   (b) limiting system means operatively connected to said bandpass filter system means for limiting the amplitude of signals received from said bandpass filter system means;
   (c) notch filter means operatively connected to said limiting system means for receiving signals therefrom and rejecting a relatively narrow band of sad signals, wherein the rejected band of said signals is within the range of 100–10000 hertz; and
   (d) low pass filter means operatively coupled to said notch filter means to further condition the signal.

2. The system of claim 1 wherein said bandpass filter means has a center frequency varying in the range of about 300 to about 3,000 Hertz.

3. The system of claim 1 wherein said bandpass filter means includes at least one parallel system path for controlling the level of signals outside of said bandwidth.

4. The system of claim 1 wherein said low pass filter system means has a variable cut off frequency.

5. The system according to claim 4 wherein said variable cut off frequency is in the range of about 500 Hertz to about 15000 Hertz.

6. The system according to claim 1 wherein said notch filter system means has a variable center frequency.

7. The system according to claim 6 wherein said variable center frequency is in the range of about 100 Hertz to about 10000 Hertz.

8. The system of claim 1 wherein said limiting system means includes amplifier means having at least one input resistor means connected thereto by a switching means, whereby the gain of said amplifier means can be varied by said switching means.

9. The system of claim 8 wherein said amplifier means has associated therewith a variable feedback resistor, whereby the gain of said amplifier means can be varied by said variable resistor.

10. The system of claim 3 wherein said parallel system means includes a switching means, whereby said parallel system path can be selectively connected or disconnected from said system.

11. The system of claim 1 further including a switching means for selectively connecting said input to said notch filter thereby bypassing said bandpass filter system and said limiter system.

12. The system of claim 1 wherein said notch filter comprises a high pass filter means and low pass filter means connected in parallel to a summing system.

13. The system of claim 12 further comprising a level controlling means connected in series with said high pass filter means and said summing system.

14. A system for processing electrical signals from at least one transducer associated with an electrified musical instrument, said system comprising:
   (a) low pass filter circuit means and high pass filter means connected in parallel with each other and each having outputs that are combined by a summing circuit means operatively coupled to said transducer for receiving signals therefrom, said low pass and high pass filter means being tuned to different cut off frequencies attenuating therethrough a preselected bandwidth of said signals.
   (b) limiting circuit means for limiting the amplitude of signals received from said filter circuit means; and
   (c) low pass filter means operatively coupled to said limiting means to further condition the signal.

15. The system of claim 14 further comprising a level controlling means connected in series with said high pass filter system.

16. The system of claim 14 wherein said low and high pass filter means have cut off frequencies of about 300 and 3000 hertz respectively.

17. A system for processing electrical signals from at least one transducer associated with an electrified musical instrument, said system comprising:
   (a) bandpass filter circuit means operatively coupled to said transducer for receiving signals therefrom and passing therethrough a relatively narrow bandwidth of said signals;
   (b) limiting circuit means operatively connected to said bandpass filter circuit means for limiting the amplitude of signals received from said bandpass filter circuit means;
   (c) notch filter means operatively connected to said limiting circuit means for receiving signals therefrom and rejecting a relatively narrow band of said signals, wherein the rejected band of said signals is within the range of 100-1000 hertz;
   (d) low pass filter means operatively coupled to said notch filter means to further condition the signal, and
   (e) time delay means operatively coupled to said low pass filter means.

18. The system of claim 17, wherein said time delay means includes a mixer means receiving inputs both directly from said low pass filter means and also from a delay system means coupled to said low pass filter means.

19. The system of claim 18 wherein said delay system means provides a time delay substantially in the ranges of about 1 to 60 milliseconds.

20. The system of claim 18, further including a feedback resistor means selectively connectable from said mixer means back to the input of said delay system means.

21. The system of claim 20, further including delay modulation system means selectively connectable to said delay system means.

22. The system of claim 21, wherein said delay modulation frequency is in the range of 0.1 to 2 hertz.

23. The system of claim 22, wherein a feedback to input signal ratio for said delay circuit means as determined by said feed back resistor means shall be substantially in the range of 0 to 0.9.

24. The system of claim 21 further comprising an additional mixing means having a pair of inputs, one input coupled to said low pass filter circuit means and the other input coupled to the output of said delay circuit means; the output of said additional circuit means in conjunction with the output of the other said mixing means providing synthesized stereo output.

25. A system for use with an electrical musical instrument for conditioning electrical signals generated by said instrument, said circuit comprising:
   (a) an amplifier circuit having input means for responding to said signals and output means for providing a conditioned output signal;
   (b) at least one compressing means operatively connected to said input means for responding to the amplitude of said electrical signals to provide a compressed signal to said amplifier circuit;
   (c) bandpass filter circuit means operatively coupled to said compressing means for receiving signals therefrom and passing therethrough a relatively narrow bandwidth of said signals;
   (d) limiting circuit means operatively connected to said bandpass filter circuit means for limiting the amplitude of signals received from said bandpass filter circuit means;
   (e) notch filter means operatively connected to said limiting circuit means for receiving signals therefrom and rejecting a relatively narrow band of bandwidth of said signals;
   (f) low pass filter means operatively coupled to said notch filter means to further condition the signal; and
   (g) time delay means operatively coupled to said low pass filter means.

26. A system for controlling electrical signals from a least one transducer associated with an electrified musical instrument comprising:
   (a) a high pass filter circuit operatively coupled to said transducer for receiving signals therefrom and passing therethrough a relatively narrow bandwidth of said signals;
   (b) limiting circuit means operatively coupled to said high pass filter for limiting the amplitude of signals received from said transducer means; and
   (c) low pass filter means operatively coupled to said limiting circuit means to further condition the signal.

27. The system according to claim 26 further comprising a low frequency boost system operatively coupled to said low pass filter means.

28. The system according to claim 26 wherein said high pass filter means has a cut off frequency varying between about 400 and about 4,000 hertz.

29. The system according to claim 26 wherein said bandpass filter system has a Q between about 0.2 and about 3.0.

30. The system according to claim 27 wherein said low frequency boost system has a corner frequency between about 60 to 600 hertz.

31. A system for controlling electrical signals from at least one transducer associated with an electrified musical instrument comprising:
   (a) at least one bandpass filter circuit means operatively coupled to said transducer for receiving signals therefrom and passing therethrough a relatively narrow bandwidth of said signals; circuit means operatively
   (b) limiting connected to said bandpass filter circuit means for limiting the amplitude of signals received from said filter circuit means;

(c) a plurality of low pass filters operatively coupled to said limiting circuit means to further condition the signal.

32. The system according to claim 31 wherein said bandpass filter means has at least one parallel system path for controlling the level of signals outside of said bandwidth.

33. The system according to claim 31 wherein said limiting system means includes amplifier means having at least one input resistor means connected thereto by a switching means, whereby the gain of said amplifier means can be varied by said switching means.

34. The system according to claim 31 wherein said limiting system means includes amplifier means having associated therewith a variable feedback resistor means, whereby the gain of said amplifier means can be varied by said variable resistor means.

35. The system according to claim 32 wherein said parallel system means includes a switching means whereby said parallel system path can be selectively connected or disconnected from said system.

36. The system according to claim 31 wherein said bandpass filter means has a center frequency varying between about 300 and about 3,000 hertz.

37. The system according to claim 31 wherein a said bandpass filter system has a Q between about 0.5 and about 3.0.

38. The system according to claim 31 wherein said low frequency boost system has a corner frequency between about 60 and 600 hertz.

39. The system according to claim 31 wherein said low pass filter system means has a variable cut off frequency.

40. The system according to claim 39 wherein said cut off frequency is variable between 500 Hertz and 15000 Hertz.

41. A circuit for controlling electrical signals from at least one transducer associated with an electrified musical instrument, said circuit having input and output terminals and comprising:
  (a) bandpass filter circuit means operatively coupled to said transducer for receiving signals therefrom and passing therethrough a relatively narrow bandwidth of said signals, wherein said bandpass filter circuit means has a center frequency varying between about 300 and about 3,000 hertz;
  (b) limiting circuit means operatively connected to said bandpass filter circuit means for limiting the signals received from said filter circuit means, said limiting circuit means comprising:
    an amplifier circuit having an input means and output means, said amplifier having a voltage gain greater than 1, and
    a feedback circuit connected between said input and output means of said amplifier circuit's said feedback circuit including at least one pair of parallel and oppositely connected diodes for operating substantially in the linear region of said diode characteristics; and
  (c) low pass filter circuit means operatively coupled to said limiting circuit means to further condition signals.

* * * * *